United States Patent
Leavitt et al.

(10) Patent No.: US 6,794,662 B1
(45) Date of Patent: Sep. 21, 2004

(54) THERMOSETTING RESIN WAFER-HOLDING PIN

(75) Inventors: William Leavitt, Haverhill, MA (US); Steven Richards, Georgetown, MA (US); Julian G. Blake, Gloucester, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/680,829

(22) Filed: Oct. 7, 2003

(51) Int. Cl.[7] ................................................. H01J 37/20
(52) U.S. Cl. ............................ 250/492.21; 250/440.11; 250/442.11
(58) Field of Search ..................... 250/492.21, 440.11, 250/442.11, 492.2, 398

(56) References Cited

U.S. PATENT DOCUMENTS

| | | |
|---|---|---|
| 5,439,523 A | 8/1995 | Yamaguchi |
| 5,801,386 A | 9/1998 | Todorov et al. |
| 5,925,886 A | 7/1999 | Seki et al. |
| 6,008,134 A | 12/1999 | Ferguson et al. |
| 6,155,436 A * | 12/2000 | Smick et al. ............ 211/41.18 |
| 6,335,534 B1 | 1/2002 | Suguro et al. |
| 6,362,474 B1 | 3/2002 | Okihara |
| 6,423,975 B1 * | 7/2002 | Smick et al. .......... 250/442.11 |
| 6,433,342 B1 * | 8/2002 | Cordts, III et al. ..... 250/440.11 |
| 6,452,195 B1 * | 9/2002 | Smick et al. .......... 250/492.21 |
| 6,462,347 B1 | 10/2002 | Oh |
| 2001/0022216 A1 | 9/2001 | Ye et al. |
| 2003/0052282 A1 * | 3/2003 | Cordts et al. .......... 250/492.21 |

* cited by examiner

*Primary Examiner*—Nikita Wells
*Assistant Examiner*—Anthony Quash
(74) *Attorney, Agent, or Firm*—Thomas J. Engellenner; Reza Mollaaghababa; Nutter McClennen & Fish LLP

(57) ABSTRACT

Wafer-holding structures formed from thermosetting resins are disclosed for use in semiconductor processing including, for example, SIMOX wafer processing. In one embodiment a pin is disclosed that is adapted to receive a wafer edge, and is coupled with a wafer holder assembly. The pin can be filled with a conductive material to provide an electrical pathway between the wafer and the wafer holder assembly, which can be coupled to a ground. This arrangement provides a conductive path for inhibiting electrical discharges from the wafer during the ion implantation process. The pin exhibits thermal isolation characteristics and sufficient hardness so as to not effect localized thermal dissipation of the wafer, yet is sufficiently soft so as to not mark or otherwise damage the wafer.

26 Claims, 15 Drawing Sheets

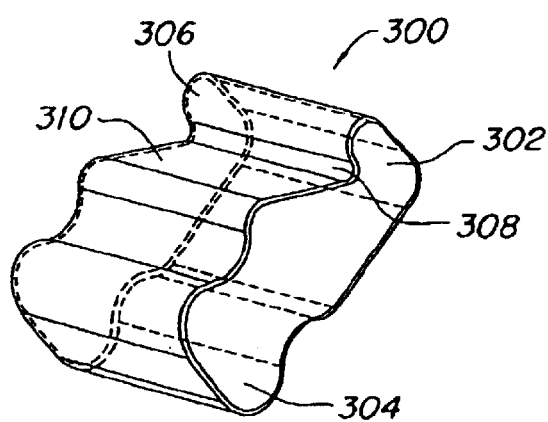
FIG. 16A
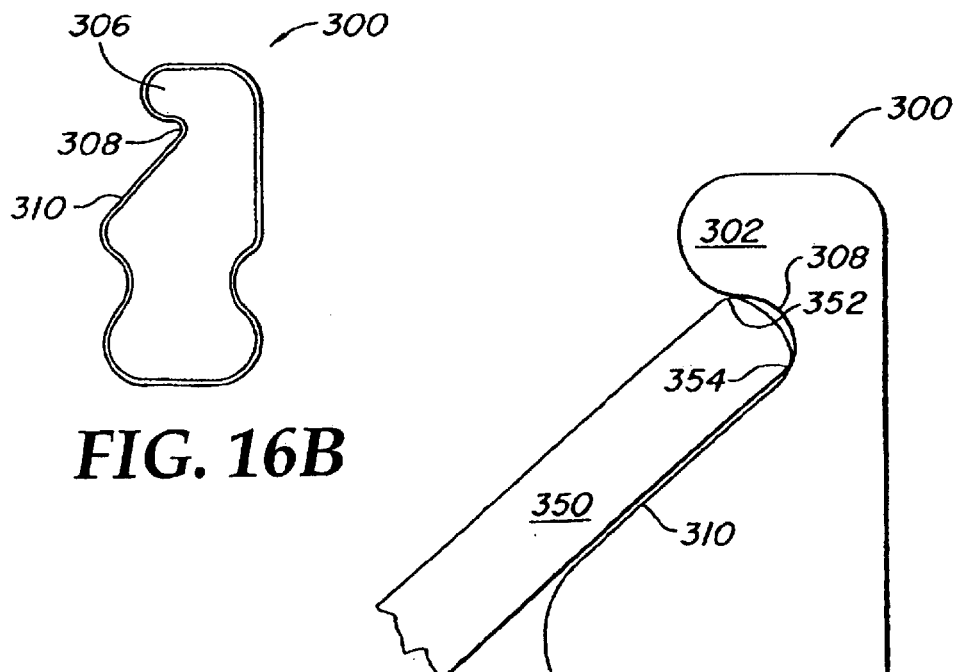
FIG. 16B
FIG 17

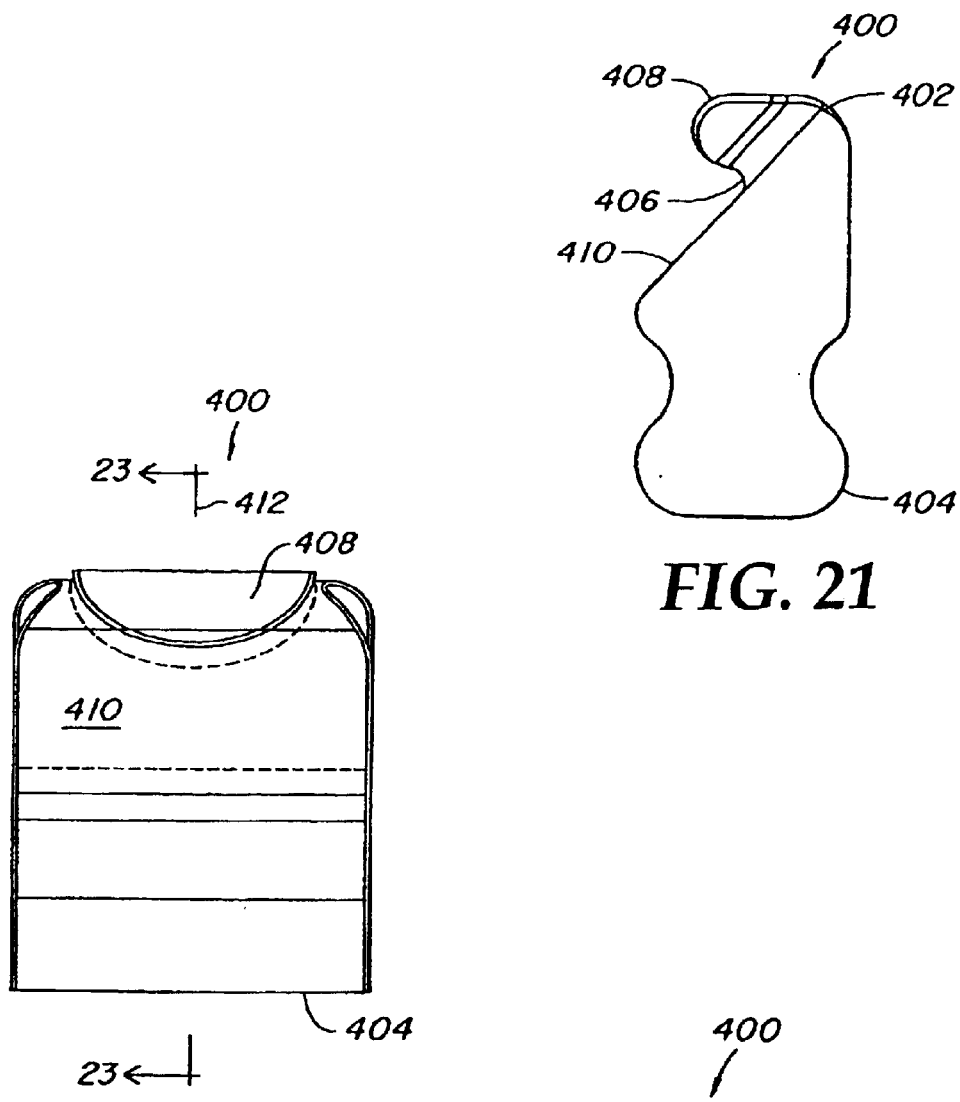
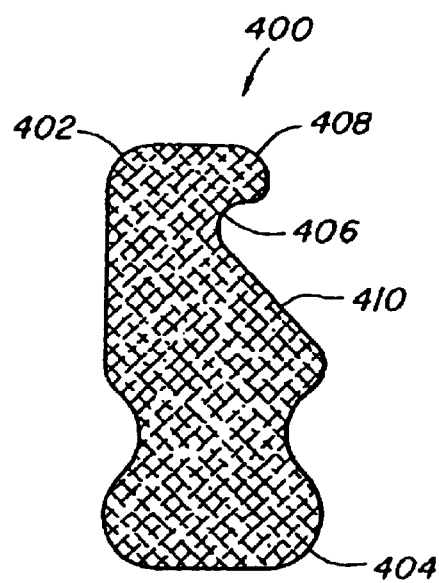
FIG. 21
FIG. 22
FIG. 23

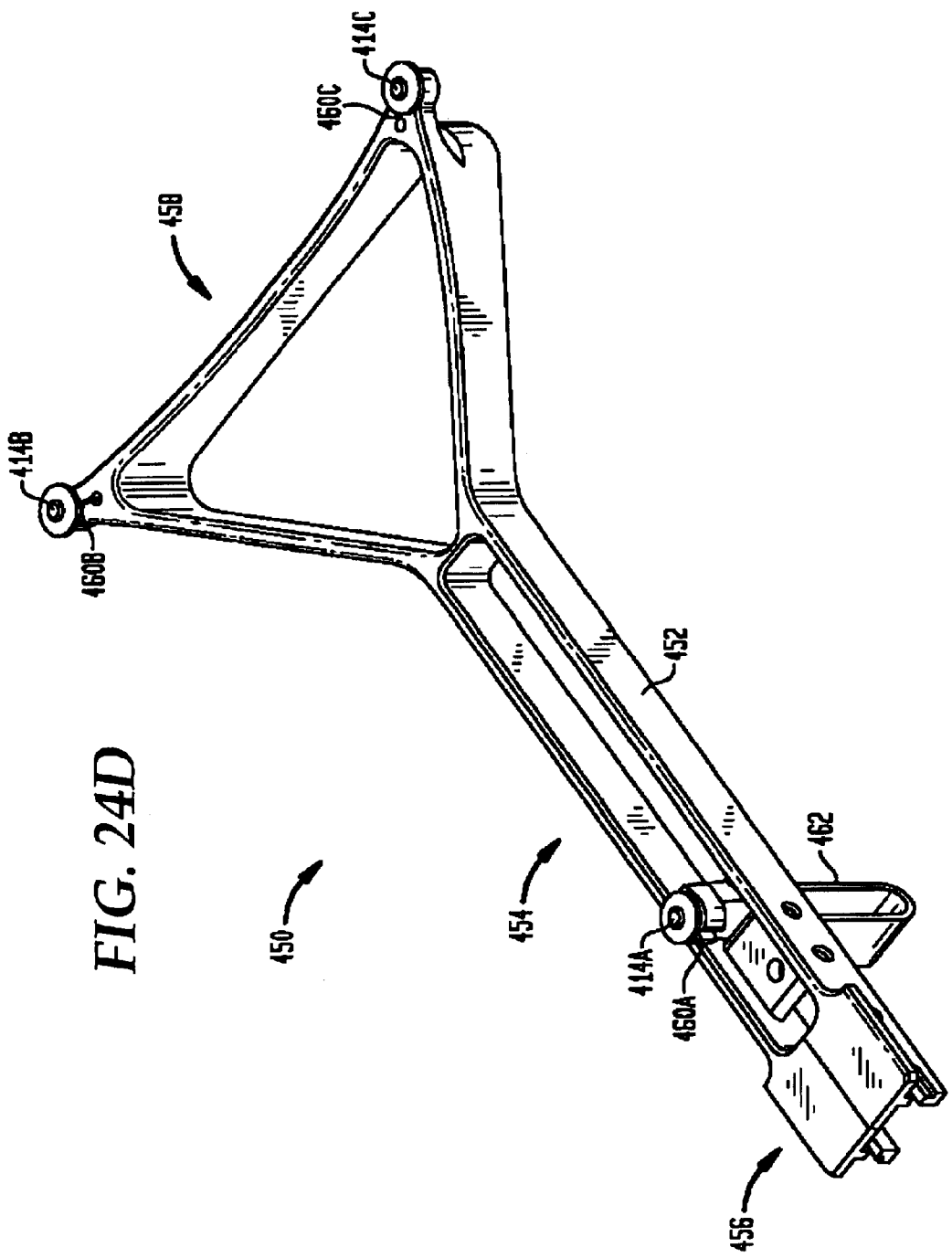

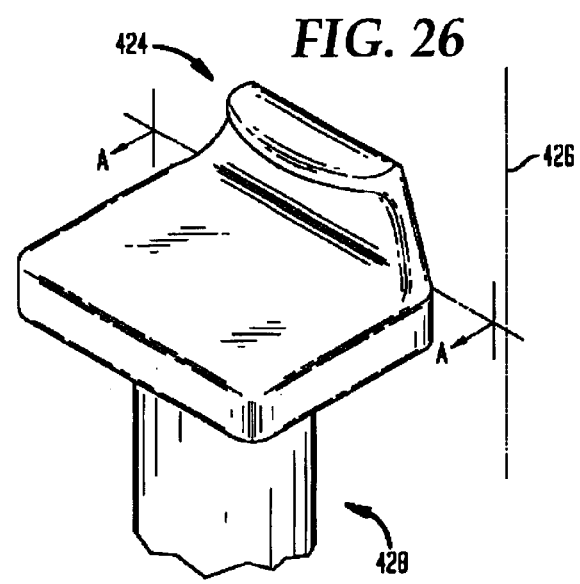
FIG. 26
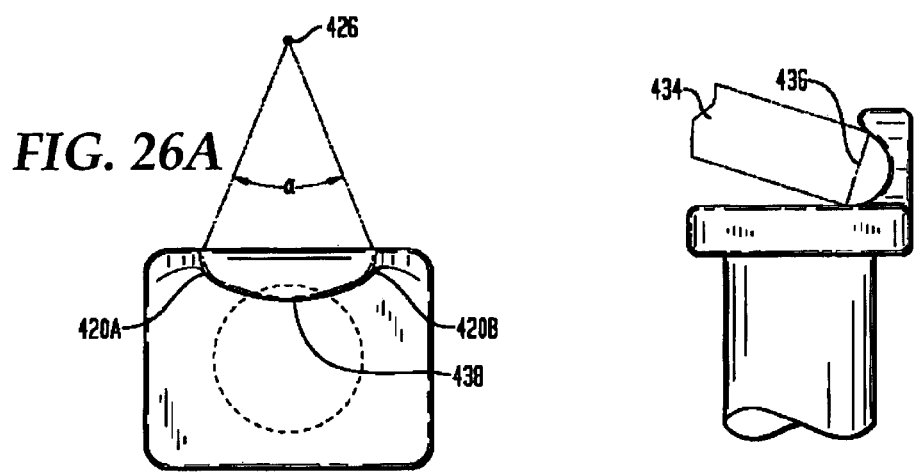
FIG. 26A
FIG. 26B

THERMOSETTING RESIN WAFER-HOLDING PIN

BACKGROUND OF THE INVENTION

The present invention relates generally to silicon wafer processing, and more particularly, to devices for holding silicon wafers as they are subjected to ion bombardment and to heat treatment.

Various techniques are known for processing silicon wafers to form devices, such as integrated circuits. One technique includes implanting oxygen ions into a silicon wafer to form buried layer devices known as silicon-on-insulator (SOI) devices. In these devices, a buried insulation layer is formed beneath a thin surface silicon film. These devices have a number of potential advantages over conventional silicon devices (e.g., higher speed performance, higher temperature performance and increased radiation hardness). The lesser volume of electrically active semiconductor material in SOI devices, as compared with bulk silicon devices, tends to reduce parasitic effects such as leakage capacitance, resistance, and radiation sensitivity.

In one known technique, known by the acronym SIMOX, a thin layer of a monocrystalline silicon substrate is separated from the bulk of the substrate by implanting oxygen ions into the substrate to form a buried dielectric layer. This technique of "separation by implanted oxygen" (SIMOX), provides a heterostructure in which a buried silicon dioxide layer serves as a highly effective insulator for surface layer electronic devices.

In the SIMOX process, oxygen ions are implanted into silicon, after which the material is annealed to form the buried silicon dioxide layer or BOX region. The annealing phase redistributes the oxygen ions such that the silicon/silicon dioxide boundaries become more abrupt, thus forming a sharp and well-defined BOX region, and heals damage in the surface silicon layer caused by the ion bombardment.

During the SIMOX process, the wafers are subjected to relatively severe conditions. For example, the wafers are typically heated to temperatures of about 500–600 degrees Celsius during the ion implantation process. Subsequent annealing temperatures are typically greater then 1000 degrees Celsius. In contrast, most conventional ion implantation techniques do not tolerate temperatures greater than 100 degrees Celsius. In addition, the implanted ion dose for SIMOX wafers is in the order of $1 \times 10^{18}$ ions per square centimeter, which can be two or three orders of magnitude greater than some known techniques.

Conventional wafer-holding devices are often incapable of withstanding the relatively high temperatures associated with SIMOX processing. Besides the extreme temperature conditions, in rotatable ion implantation systems a secure wafer gripping problem arises. Furthermore, wafer-holding structures having exposed metal are ill-suited for SIMOX processes because the ion beam will induce sputtering of the metal and, thus, result in wafer contamination. In addition, the structure may deform asymmetrically due to thermal expansion, which can damage the wafer surface and/or edge during high temperature annealing so as to compromise wafer integrity and render it unusable.

Another disadvantage associated with certain known wafer holders is electrical discharge of the wafers. If a wafer holder is formed from electrically insulative materials, the wafer will become charged as it is exposed to the ion beam. The charge build up disrupts the implantation process by stripping the ion beam of space charge neutralizing electrons. The charge built-up on the wafer can also result in a discharge to a nearby structure via an electrical arc, which can also contaminate the wafer or otherwise damage it.

Another disadvantage associated with conventional wafer holders in rotatable ion implantation systems is the lack of secure and efficient wafer gripping. Failure to secure a wafer against the centrifugal forces that are present in a rotatable system can result in damage to the wafer. If a wafer is not precisely placed and secured in the wafer holder, the wafer can fall out of the wafer holder assembly or otherwise be damaged during the load, unload, and ion implantation process.

Even when the wafer is held secure, many techniques cause other damage to the wafer during the ion implantation process. For example, holding pins can crush when securing the wafer causing localized thermal drifts much like a heat sink thus damaging wafer integrity. Wafer-holding pins formed of hard materials can leave marks on the wafer, yet pins formed of soft materials can stick to the wafer; neither situation is desirable.

Mears et al. (U.S. Pat. No. 4,817,556) discloses a device for holding a wafer. Mears utilizes a collet containing a plurality of fingers that apply lateral pressure to the edge surface of the wafer. Mears teaches contacting the entire edge of the wafer, and does not disclose the importance of reducing the contact area. The fingers of the Mears device are flush against the edge of the wafer, which increases the contact area, and can result in electrical arcing between the finger and the wafer. Particularly, any voids (microscopic or otherwise) in the finger/wafer contact area, can initiate an electrostatic discharge that can damage the wafer.

Another disadvantage associated with some existing wafer holders is shadowing. Shadowing is encountered when wafer holder structures obstruct the path of the ion beam, and thereby prevent implantation of the shadowed wafer regions. This deprivation of usable wafer surface area is a common problem in wafer holders that do not reduce the profile of their structural components.

It would, therefore, be desirable to provide a wafer holder that is able to withstand the relatively high temperatures and energy levels associated with SIMOX wafer processing while also reducing the potential for sputter contamination. In addition, it would be desirable to provide a wafer-holding pin that reduces arcing, reduces shadowing, and provides a simpler wafer-gripping capability.

SUMMARY OF THE INVENTION

The present invention provides a polymeric wafer-holding structures that maintain their structural integrity and prevent the build up of electrical charge on the wafer during high temperature semiconductor processing. Although thermoset polymeric materials have been generally thought to be incompatible with semiconductor fabrication processes that are carried out at a high temperatures, e.g., about 250 C, it has been discovered that thermoset polymers, when placed in service under vacuum conditions, can actually withstand temperatures of 600 C, or higher, without degradation.

Although the invention is primarily shown and described in conjunction with SIMOX wafer processing, it is understood that the wafer-holding pin has other applications relating to implanting ions into a substrate and to wafer processing in general.

In one aspect of the invention, a wafer-holding pin formed from a thermosetting resin material is disclosed and can be used to hold a wafer in a vacuum environment at a temperature of between about 250 C and about 650 C. The thermoset material is able to withstand an oxygen ion beam without substantial oxidation. The pin has distal and proximal portions, and the distal one can be adapted to hold the wafer via a groove that is sized and shaped to receive an edge of the wafer. The proximal portion is adapted to couple with a wafer-holding assembly.

More specifically, the pins of the present invention can have distal portion that includes a head coupled to a flange with a wafer-receiving groove therebetween. The groove is adapted to engage an edge of the wafer and has an inner surface that is at least partially cylindrical in shape. The inner surface can exhibit a radial symmetry about an axis for an azimuthal angle of at least 45 degrees.

In a further aspect of the invention, the wafer-holding pin provides a conductive path from the wafer to the assembly, which can be coupled to ground. By grounding the wafer, any build up of electrical charge on the wafer is inhibited for preventing potentially damaging electrical arcing from the wafer during the ion implantation process. In an exemplary embodiment, the pin is filled with an electrically conductive material, for example, carbon. The material provides electrical conductivity for the wafer-holding pin to achieve optimal SIMOX wafer processing conditions.

In yet another aspect of the invention, the wafer-holding pins have a geometry that is effective to reduce the likelihood of electrical discharges from the wafer. In one embodiment, the pins have a proximal portion for coupling to a distal end of wafer-holding arms in a wafer-holding assembly and a distal portion for holding the wafer. In one embodiment, the distal portions have an arcuate wafer-receiving neck disposed between a wedge-shaped upper region and a tapered surface. The geometry of the pin upper region reduces the amount of pin material proximate the wafer so as to reduce the likelihood of electrical arcing between the wafer and the pin during the ion implantation.

In another aspect of the invention, the wafer-holding pins have a geometry that reduces the need for precise alignment and provides a simpler wafer gripping capability. These pins facilitate wafer placement into the wafer holder, and pin coupling to the wafer holder assembly. In one embodiment, the pins have a proximal portion for coupling to a base structure of the wafer-holding assembly, and a distal portion for holding the wafer. The distal end of the pin is further defined by having a longitudinal axis extending from the distal portion towards the proximal end. The distal portion is at least partially radially symmetric about the longitudinal axis (or a line parallel thereto), and has a wafer-receiving groove disposed between a head and a flange. The wafer-receiving groove preferably contacts only the top and bottom of the wafer edge.

Due to the cylindrical symmetry of the distal portion, the need for precise pin alignment with the wafer is relaxed. The pins are able to engage a wafer across a much wider angle of approach. Thus, the radial symmetry reduces the need for precision in aligning the pins when they are attached to the other elements of the wafer-holding assembly.

In addition, the wafer-receiving groove contacts top and bottom regions of the wafer edge such that the area of the pin in contact with the wafer edge is reduced. This reduces arcing between the wafer edge and the pin during the ion implantation process.

The geometry of the head of the distal portion can also be effective in reducing the pin profile, by reducing the amount of pin material proximate the wafer. This has the effect of reducing not only arcing but also shadowing, thereby facilitating ion implantation of the entire wafer surface area.

In a further aspect of the invention, an ion implanter with a wafer-holding assembly uses a pin comprised of a thermosetting resin material suitable for use in a vacuum environment operating at a temperature of about 250 C to about 650 C, and is able to withstand an oxygen ion beam without substantial oxidization.

BRIEF DESCRIPTION OF THE DRAWINGS

The invention will be more fully understood from the following detailed description taken in conjunction with the accompanying drawings, in which:

FIG. 16A is a perspective view of a wafer-holding pin that forms a part of the wafer holder assembly of FIG. 1;

FIG. 16B is a side view of the wafer-holding pin of FIG. 15;

FIG. 17 is a side view of the wafer-holding pin of FIG. 15 shown holding a wafer;

FIG. 21 is a side view of the wafer-holding pin of FIG. 18;

FIG. 22 is a front view of the wafer-holding pin of FIG. 18;

FIG. 23 is a cross-sectional view of the wafer-holding pin of FIG. 20 along line 23—23;

FIG. 24D is a wafer holder assembly according to the invention utilizing the wafer-holding pins illustrated in FIG. 24A;

FIG. 26 is a perspective view of another wafer-holding pin in accordance with the present invention;

FIG. 26A is a top view of the wafer-holding pin of FIG. 26 in which the depicted wafer contact surface extends for an azimuthal angle of less than 360 degrees; and FIG. 26B is a side view of the wafer-holding pin of FIG. 26 and FIG. 26A.

DETAILED DESCRIPTION

The present invention provides a wafer-holding pin that is well-suited for use with SIMOX wafer processing including use of relatively high ion beam energies and temperatures in a vacuum or reduced pressure environment. In general, the wafer-holding pin has a structure that maintains its integrity and reduces the likelihood of wafer damage during extreme conditions associated with SIMOX wafer processing. The wafer-holding pin can be formed from a thermosetting resin that can be filled with a conductive material to provide an electrical path from the wafer to ground for preventing electrical charging of the wafer, and possible arcing, during the ion implantation process.

Figure 1:
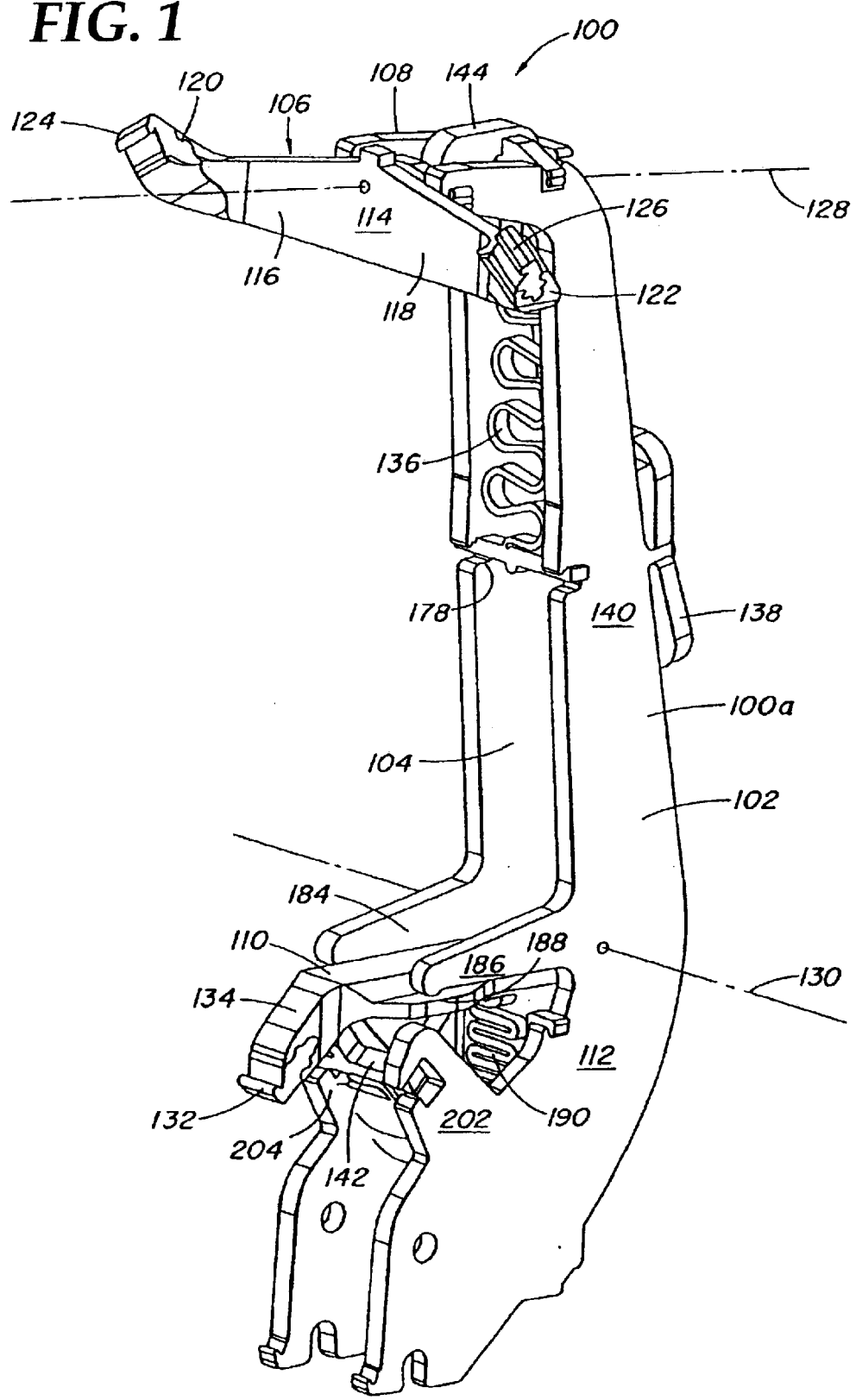
FIG. 1 is a perspective view of a wafer holder assembly in accordance with the present invention.
Figure 2:
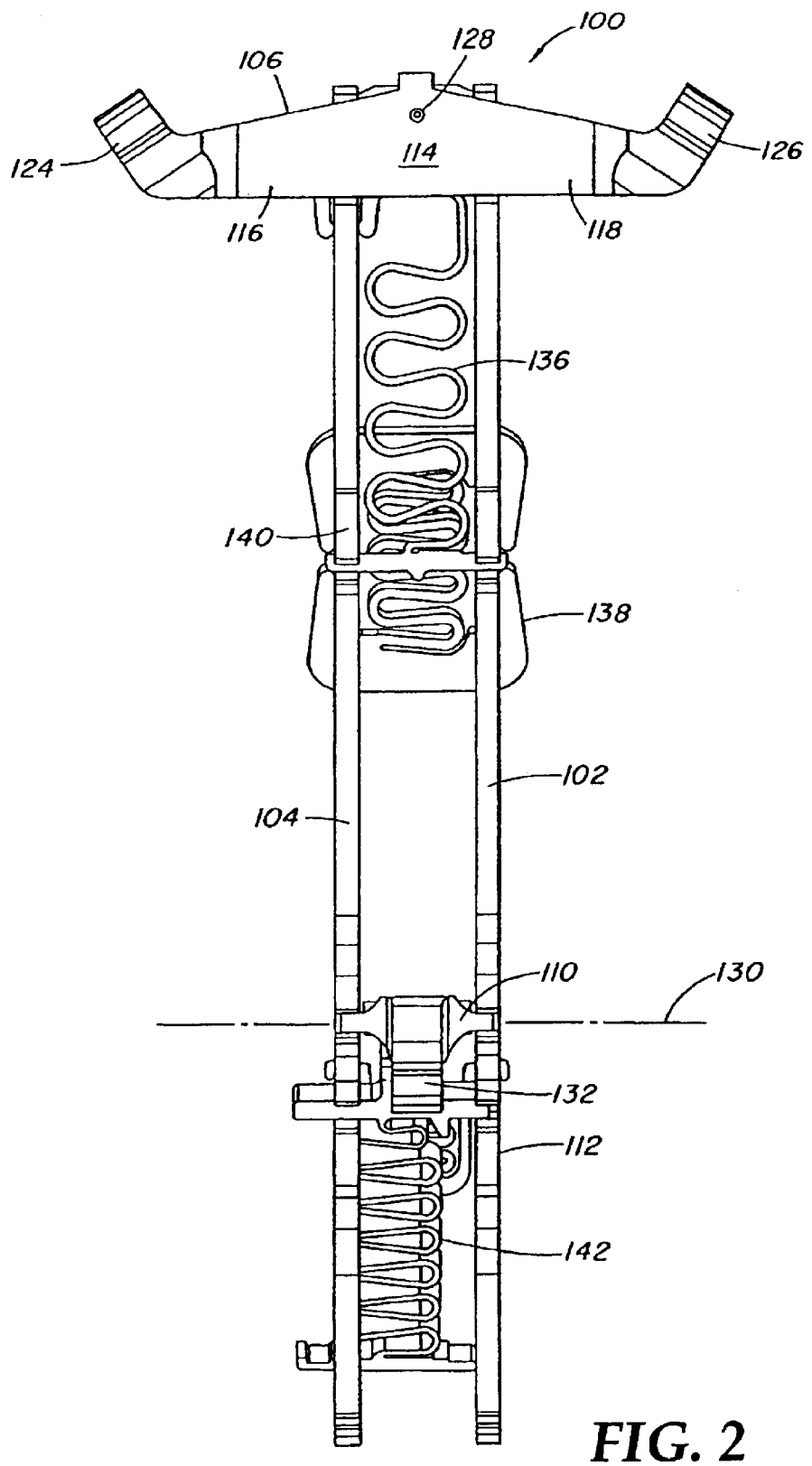
FIG. 2 is a front view of the wafer holder assembly of FIG. 1.

FIGS. 1–2 show a wafer holder assembly 100 suitable for using a wafer-holding pin in accordance with the present invention. The assembly includes first and second main structural rail members 102, 104 that are substantially parallel to each other and spaced apart at a predetermined distance. In the exemplary embodiment shown, the main structural members 102, 104 are generally C-shaped. A first wafer-holding arm 106 is rotatably secured to a distal end 108 of the holder assembly and a second wafer-holding arm 110 is pivotably secured to the assembly at a generally proximal region 112 of the assembly.

The first arm 106 includes a transverse member 114 having first and second portions 116, 118 each of which terminates in a respective distal end 120, 122. Wafer-holding pins 124, 126 are secured to the distal ends 120, 122 of the first and second arm portions. The first arm 106 is rotatable about a first axis 128 that is generally parallel to the first and second main structural members 102, 104. By allowing the first arm 106 to rotate about the first axis 128, the first and second arm portions apply substantially equal pressure to the wafer edge via the spaced apart wafer-holding pins 124, 126.

The second arm 110 is pivotable about a second axis 130 that is generally perpendicular to the main structural members 102, 104 to facilitate loading and unloading of the wafers. A wafer-holding pin 132 is affixed to the distal end 134 of the second arm to provide, in combination with the pins 124, 126 coupled to the first arm 106, three spaced apart contact points to securely hold the wafer in place.

Typically, placement of the pins about the circumference of the wafer is limited by a notch or "significant flat" in the wafer that is used for orientating the wafer on the holder assembly. Some processing techniques include rotating the wafer a quarter turn, for example, one or more times during the implantation process to ensure uniform doping levels.

The wafer holder assembly can further include a series of retaining members for securing the components of the assembly together without the need for conventional fasteners and/or adhesives. It is understood that adhesives can vaporize or outgas during the ion implantation process and contaminate the wafer. Similarly, conventional fasteners, such as exposed metal screws, nuts, bolts, and rivets can also contaminate the wafer. In addition, such devices may have incompatible thermal coefficients of expansion making the assembly prone to catastrophic failure.

In one embodiment, the assembly includes a distal retaining member 136 coupling the first arm 106 to the assembly and an intermediate retaining member 138 affixed to a bottom of the assembly to maintain the spacing of the first and second main structural members 102, 104 in a middle region 140 of the assembly. The assembly can further include a proximal retaining member 142 securing the structural members in position at the proximal region 112 of the assembly.

Figure 3:
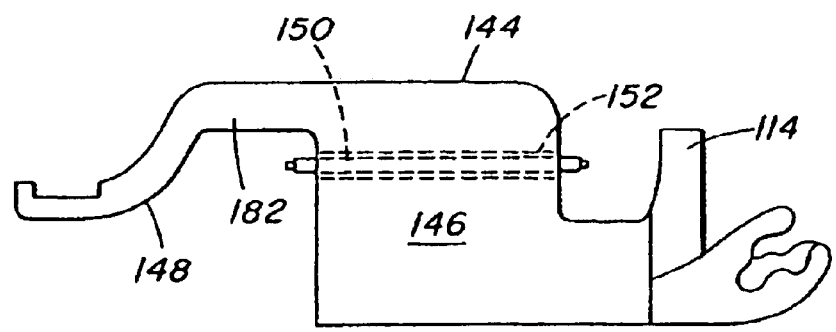
FIG. 3 is a side view of a first arm that forms a part of the wafer holder assembly of FIG. 1.
Figure 4:
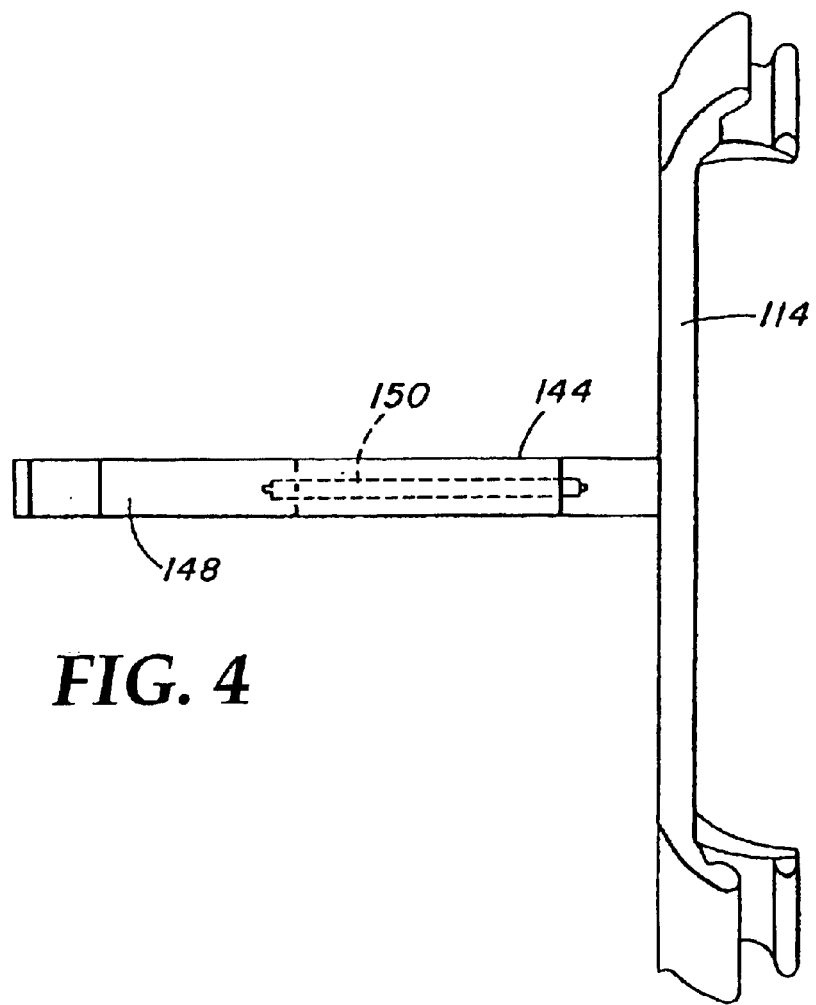
FIG. 4. is a top view of the first arm assembly of FIG. 3.

FIGS. 3–7 (shown without the wafer-holding pins), in combination with FIGS. 1 and 2, show further details of the wafer holder assembly structure. The first arm 106 includes a support member 144 extending perpendicularly from the transverse member 114 (FIGS. 3–4). The support member 144 includes an intermediate region 146 and an arcuate coupling member 148. A bearing member 150 extends through a longitudinal bore 152 in the intermediate region 146 of the support member 144 (FIGS. 3–4).

Figure 5:
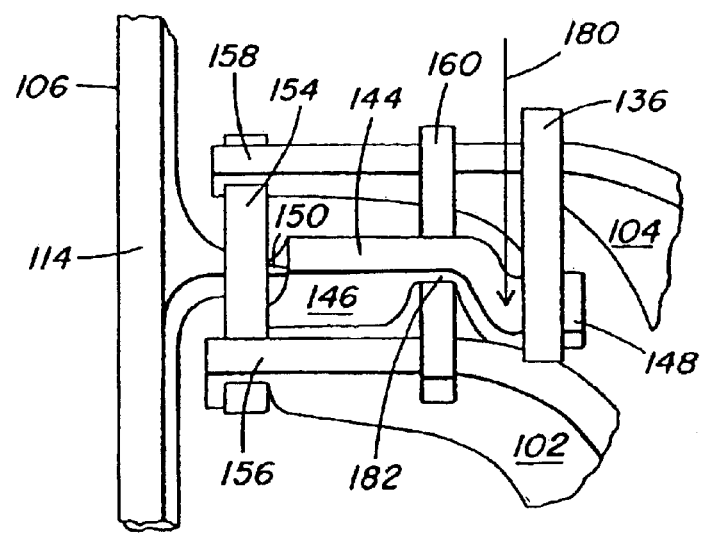
FIG. 5 is a perspective view of a distal region of the wafer holder assembly of FIG. 1.
Figure 6:
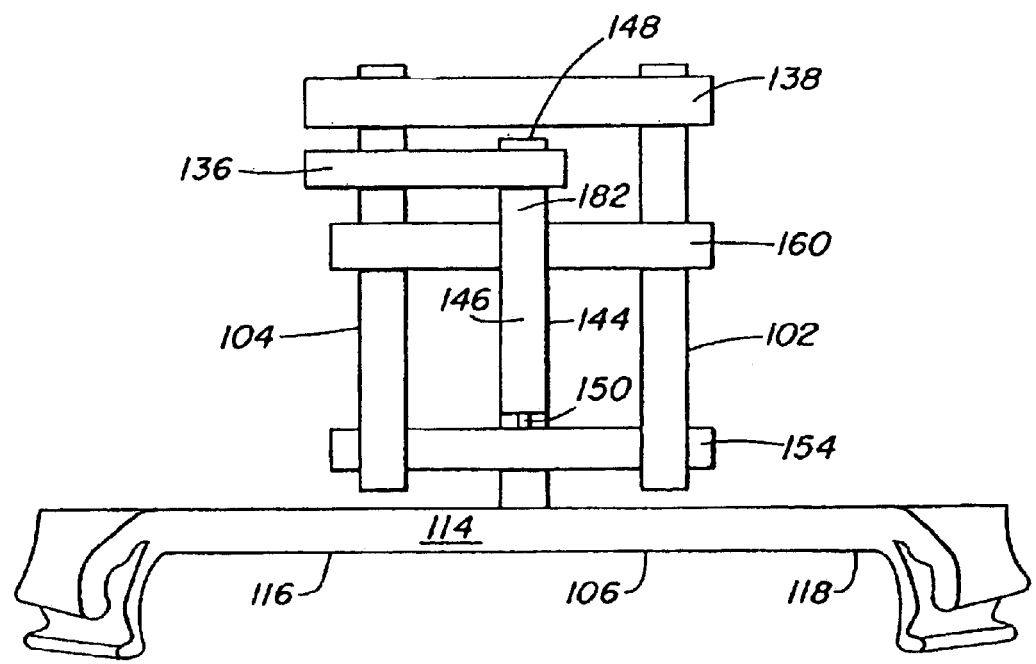
FIG. 6 is a top view of the distal region of FIG. 5.
Figure 7:
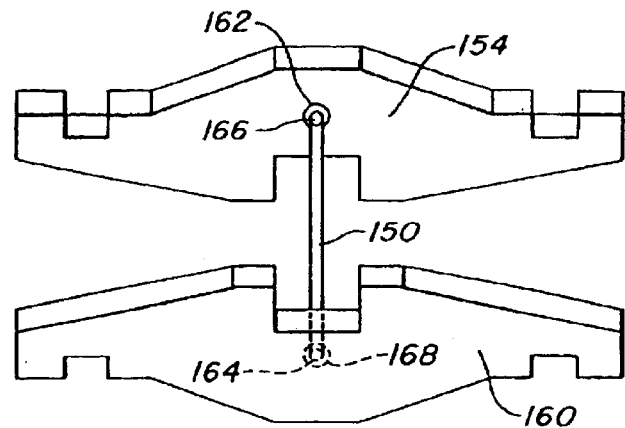
FIG. 7 is a perspective view of first and second cross members that are engageable with the first arm assembly of FIG. 3.

A first cross member 154 is matable with the distal ends 156, 158 of the main structural members 102, 104 and a second cross member 160 is matable to the main structural members at a predetermined distance from the first cross member 154 (FIGS. 5–6). The first and second cross members 154, 160 are adapted for mating with opposite edges of the main structural members 102, 104. It is understood that notches can be formed in the various components to receive mating components. Each of the first and second cross members 154, 160 includes a respective bore 162, 164 for receiving an end of the bearing member 150. (FIG. 7). In one embodiment, the bearing member is a rod having each end seated within respective sleeve members 166, 168 disposed within an aperture in the cross members 154, 160. The sleeve members 166, 168 allow the first arm 106 to freely rotate while minimizing particle generation due to graphite on graphite contact during rotation of the first arm. In one embodiment, the sleeves are formed from a hard, insulative material, such as aluminum oxide (sapphire).

Figure 8:
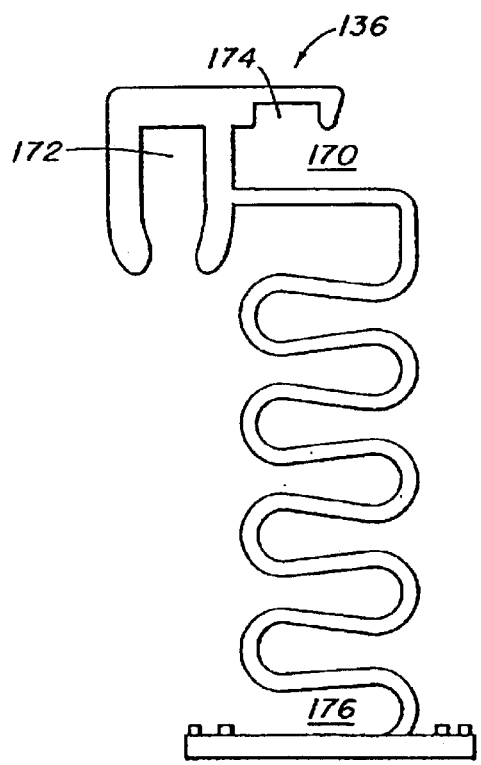
FIG. 8 is a side view of a distal retaining member that forms a part of the wafer holder assembly of FIG. 1.

FIG. 8, in combination with FIGS. 1 and 2, show further details of the distal retaining member 136 having a first end 170 with a first notch 172 for coupling to one of the main structural members 102 and a second notch 174 for engaging the coupling member 148 (FIG. 3) of the first arm. A second end 176 of the distal retaining member 136 is matable to the intermediate region 140 of the assembly. Indents 178 can be formed in the main structural members 102, 104 to facilitate engagement of the second end 176 to the assembly (FIG. 1).

Figure 9:
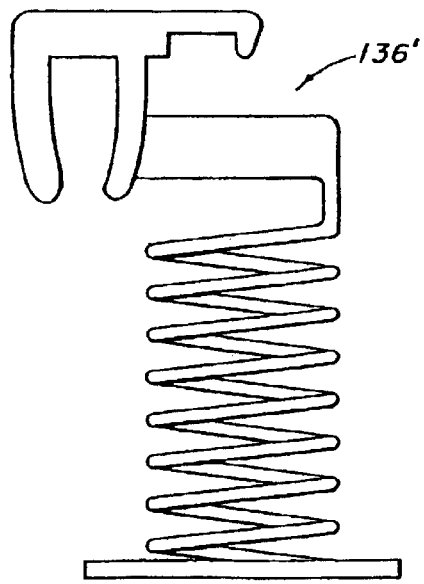
FIG. 9 is a side view of an alternative embodiment of the distal retaining member of FIG. 8.
Figure 10:
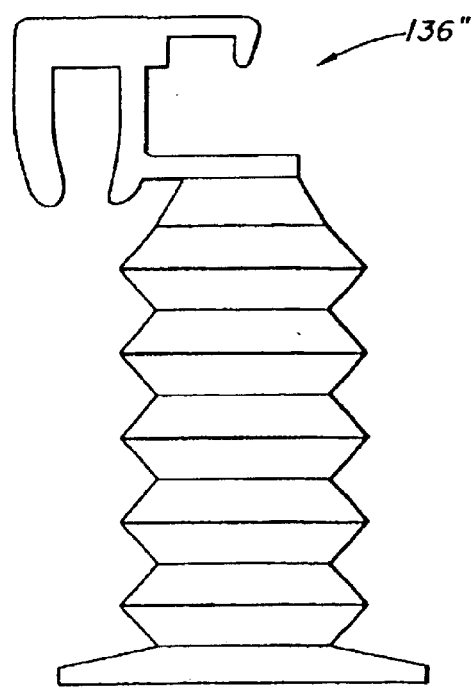
FIG. 10 is a side view of a further alternative embodiment of the distal retaining member of FIG. 8.

FIGS. 9–10 show alternative embodiments of the distal retaining member in the form of a helical spring 136' and a bellows 136", respectively. It is understood that one of ordinary skill in the art can readily modify the geometry of the retaining members.

In one embodiment, the distal retaining member 136 is under tension so as to apply a force having a direction indicated by arrow 180 (FIG. 5) on the coupling member 148 of the support member. The force applied by the distal retaining member 136 pressures a neck 182 (FIG. 3) of the support member against the second cross member 160. The applied force also pressures the first cross member 154, via the bearing member 150, against the main structural members 102, 104 as the second cross member 160 functions as a fulcrum for the support member 144. However, the transverse portion 114, as well as the support member 144 of the first arm, freely rotate about the first axis 128, i.e., the bearing member 150, such that the pins 124, 126 at the distal ends of the first arm portions 116, 118 provide substantially equal pressure on the wafer.

Figure 11:
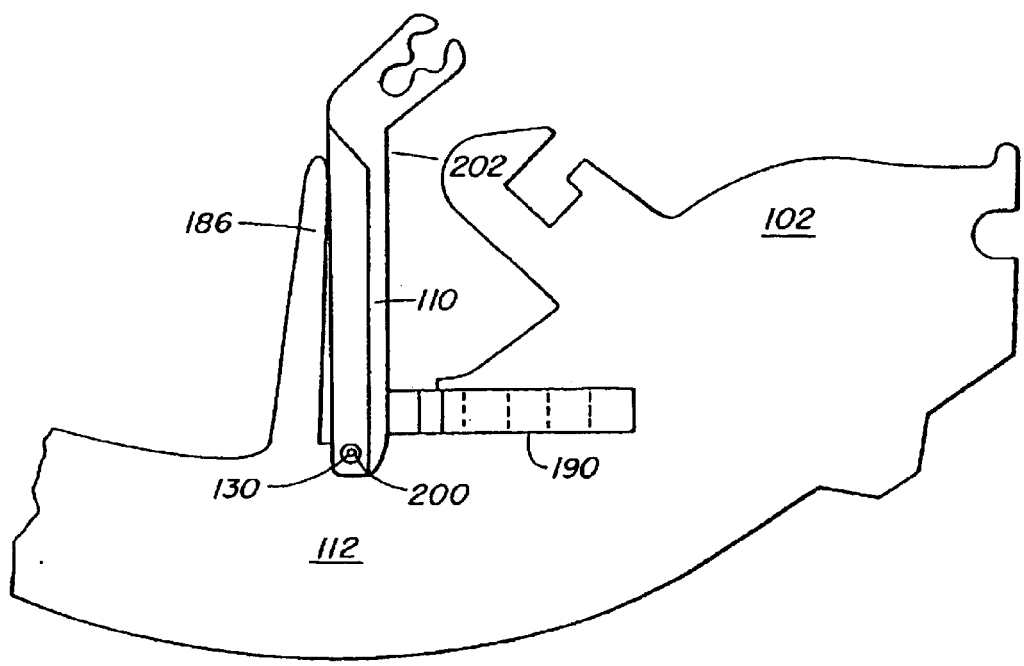
FIG. 11 is a partial side view of a proximal portion of the wafer holder assembly of FIG. 1.
Figure 12:
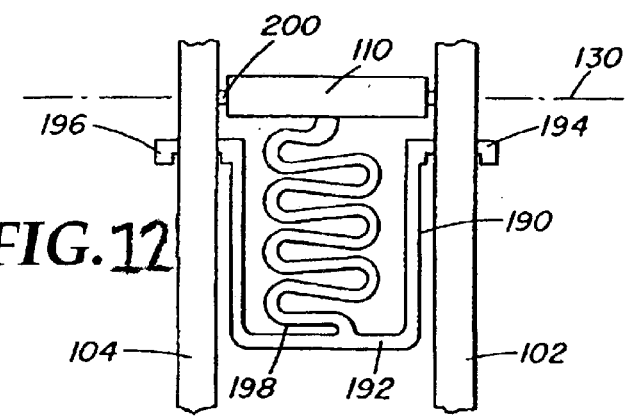
FIG. 12 is a bottom view of a proximal portion of the wafer holder assembly of FIG. 1.

FIGS. 11 and 12 (bottom view), in combination with FIGS. 1 and 2, show further details of the second proximal region 112 of the wafer holder assembly 100. FIG. 11 is shown without the second main structural member 104 for clarity. First and second stop members 184 (FIG. 1), 186 extend from the main structural members 102, 104. In an exemplary embodiment, the second arm 110 includes wing regions 188 (FIG. 1) that are biased against the ends of the stop members 184, 186 by a bias member 190. In one embodiment, the bias member 190 is under compression so as to pressure the second arm 110 against the stop members 184, 186, e.g., the wafer-hold position. The bias member 190 includes a U-shaped outer portion 192 having a first end 194 mated to the first structural member 102 and a second end 196 coupled to the second structural member 104 (FIG. 12). A spring portion 198 of the second bias member includes one end abutting the second arm member 110 and the other end extending from a bottom of the U-shaped outer member 192.

The second arm 110 pivots at its bottom end about a second bearing member 200 disposed on the second axis 130, which is generally perpendicular to the main structural members 102, 104. The second bearing member 200 extends through a bore in the second arm with each end of the bearing member being seated in a sleeve inserted within a respective main structural member 102, 104. Rotation of the second arm 110 is limited by respective brace members 202, 204 extending from the main structural members 102, 104.

Figure 13:
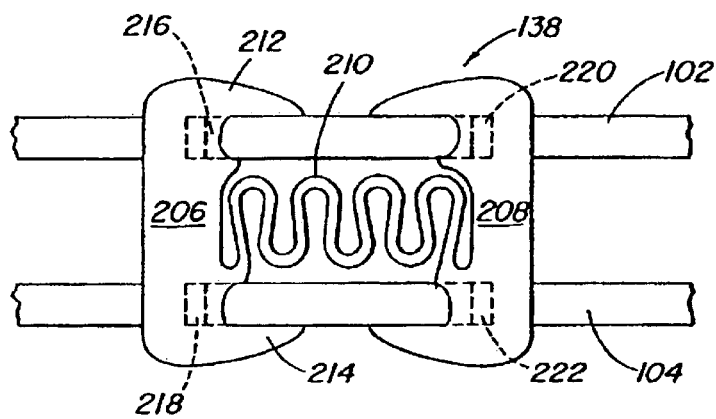
FIG. 13 is a bottom view of an intermediate retaining member that forms a part of the wafer holder assembly of FIG. 1.

FIG. 13 (bottom view), in combination with FIGS. 1 and 2, shows further details of the intermediate retaining member 138, which is mated to the main structural members 102, 104 in the intermediate region 140 of the assembly. The intermediate retaining member 138 includes first and second opposing U-shaped outer members 206, 208 with a spring member 210 extending therebetween. The first outer member 206 has first and second arms 212, 214 for mating engagement with corresponding notched protrusions 216, 218 formed on the bottom of the main structural members 102, 104. Similarly, the second outer member 208 includes arms that are matable with notched protrusions 220, 222. In one embodiment, the U-shaped outer members 206, 208 are forced apart to facilitate mating to the protrusions. Upon proper positioning, the outer members 206, 208 are released such that spring member 210 biases the outer members against the protrusions. The intermediate retaining member 138 is effective to maintain the spacing between the first and second main structural members 102, 104 and enhance the overall mechanical strength of the assembly.

Figure 14:
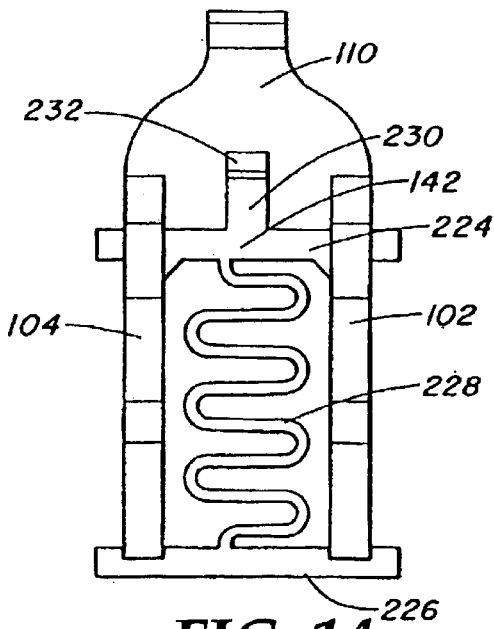
FIG. 14 is a partial side view of a proximal retaining member that forms a part of the wafer holder assembly of FIG. 1.

FIG. 14 shows the proximal retaining member 142, which provides structural rigidity in the proximal region 112 of the wafer holder assembly. In one embodiment, the proximal retaining member 142 includes upper and lower members 224, 226 coupled by a spring member 228. The spring member 228 can be engaged to the main structural members such that the spring member is under tension. The proximal retaining member 142 can include a protruding member 230 having a slot 232 formed therein.

Figure 15:
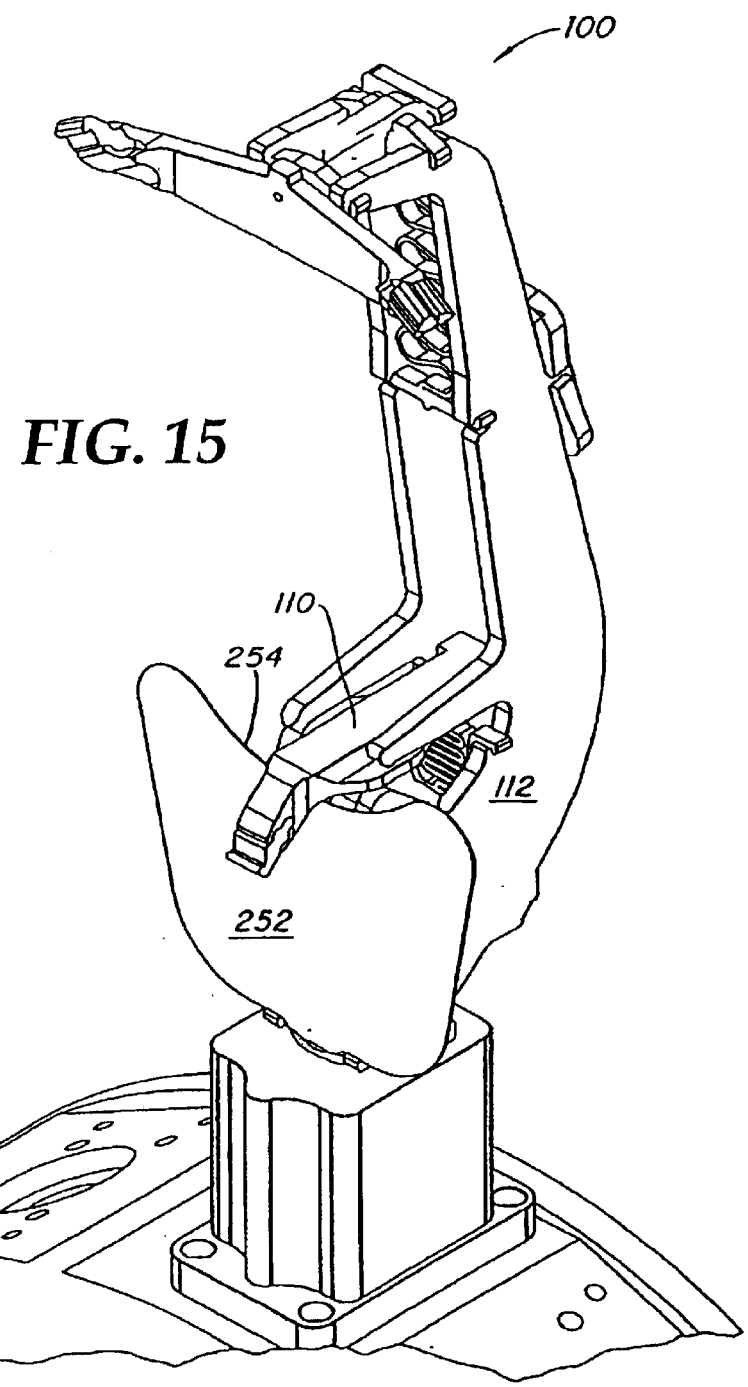
FIG. 15 is a perspective view of a further embodiment of a wafer holder assembly in accordance with the present invention.
Figure 18:
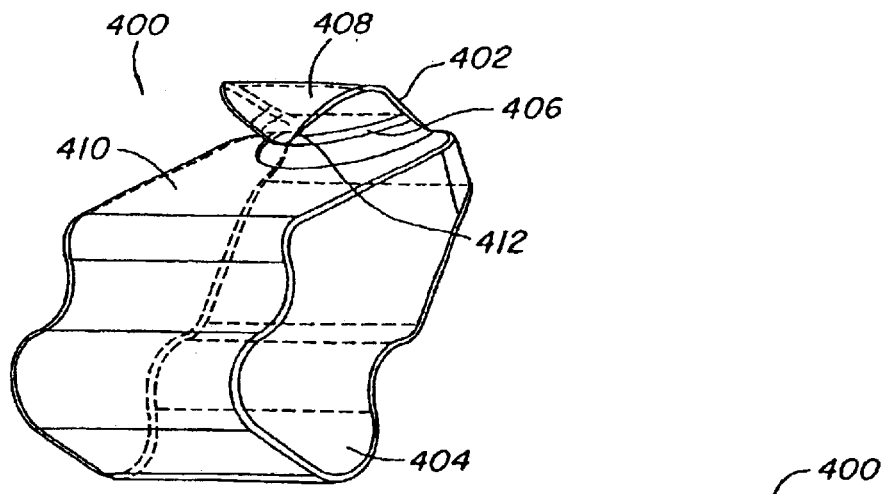
FIG. 18 is a perspective view of a wafer-holding pin in accordance with the present invention.
Figure 19:
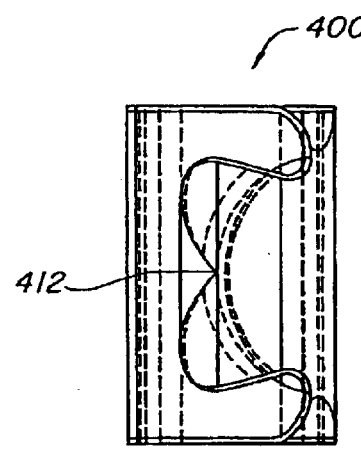
FIG. 19 is a top view of the wafer-holding pin of FIG. 18.
Figure 20:
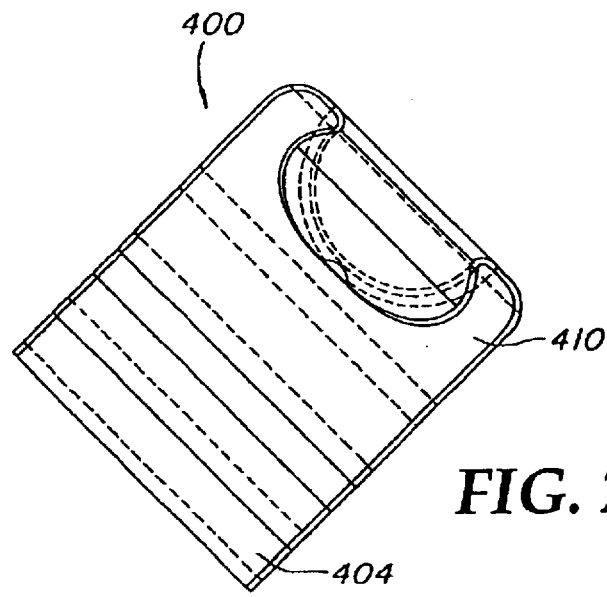
FIG. 20 is an angled view of the wafer-holding pin of FIG. 18

As shown in FIG. 15, the assembly 100 is matable with a rotatable hub assembly 250 to which a series of wafer holder assemblies can be secured. A shield 252 can be secured to the proximal region 112 of the assembly to protect exposed regions of the assembly from beam strike. The shield 252 prevents sputtering from the assembly components, as well as any metal devices used to affix the assembly to the hub 250, during the ion implantation process. In addition, the assembly components are not heated by direct exposure to the ion beam. In one embodiment, an edge of the shield 252 is captured in the slot 232 (FIG. 14) located in the proximal retaining member 142.

It is understood that the shield 252 can have a variety of geometries that are effective to shield the assembly components from beam strike. In one embodiment, the shield 252 is substantially flat with an arcuate edge 254 proximate the second wafer-holding arm 110 to increase the shielded region of the assembly.

It is further understood that the shield can be formed from various materials that are suitably rigid and are opaque to the ion beam. One exemplary material is silicon having properties that are similar to a silicon wafer.

The wafer-holding pins 124, 126, 132 coupled to ends of the wafer-holding arms are adapted for contacting and securing the wafer in the wafer holder assembly 100. In general, the pins should apply sufficient pressure to maintain the wafers in the holder assembly during the load and unload process in which the wafers are manipulated through a range of motion that can include a vertical orientation. However, undue pressure on the wafers should be avoided since damage to the wafer surface and/or edge can result in the formation of a slip line during the subsequent high temperature annealing process. In addition, the wafer-holding pins should not electrically insulate the wafer from the assembly. Further, the pins should be formed from a material that minimizes contamination of the wafer, and that in thermally insulative so as to not act as a heat sink.

In a preferred embodiment, the wafer-holding pins are manufactured of a material comprising a thermosetting polyimide resin having properties. These materials can have excellent mechanical properties such as low friction, good hardness, are easy to machine and contain little, if any, metals. Although thermoset polymeric materials have been generally thought to be incompatible with semiconductor fabrication processes that are carried out at a high temperatures, e.g., 250 C, it has been discovered that thermoset polymers, when placed in service under vacuum conditions, can actually withstand temperatures of 600 C, or higher, without degradation. Thus, this discovery allows wafer-holding pins comprised of a thermosetting resin to be used within ion implanters, such as in SIMOX applications.

One preferred class of polymers useful in the present invention are polyimides because of their excellent heat resistance, chemical resistance and mechanical properties. Polyimides can be obtained by the polycondensation of an aromatic carboxylic acid with an aromatic amine. One resin used herein has an imide bond in its main chain, however, polyamideimide resins having an imide bond and an amide bond in its main chain can also be used. Vespel® polyimides (Dupont, Wilmington, Del.) and particularly, the Vespel® SCP family of resins are examples of polymeric materials useful in the present invention.

The polyimide resins disclosed herein do not melt or otherwise degrade under the high temperature conditions that occur in an ion implantation chamber and they can exhibit good frictional and abrasion characteristics over a wide temperature range to secure the wafer. Further, the cured resins have sufficient softness to not cause marking on the wafer, yet have sufficient hardness to hold the wafer without significant crushing or conformity to the edge of the wafer. For example, in a preferred embodiment, the resin has a hardness between about 7 and about 1 on the Mohs' scale of hardness, yet are at least sufficiently hard to prevent the pin from crushing under the forces necessary to secure the wafer. More preferably, the hardness can range from about 6 to about 2 on the Mohs' scale. Generally speaking, the hardness should be less than about 6 on the Mohs' scale.

It will be understood that pins conforming to the wafer edge can cause localized heat differentials during heating of the wafer. Thus, the polyimide resins disclosed are sufficiently thermally insulative to eliminate or substantially mitigate localized cooling during wafer processing. In a preferred embodiment, for example, the resin can have thermal conductivity between about 1.0 W/m deg. K. and about 0.01 W/m deg. K. Generally speaking, the thermal conductivity of the resin should be below about 0.5 W/m deg. K.

The terms "thermosetting resin," "thermoset polymers" and similar variations, as used herein, are intended to encompass polymeric materials that harden when heated and cannot be easily remolded. Such resins include, but are not limited to, Polyimides (e.g., Vespel®), Polyetheretherketone (e.g., PEEK-HT® and PEEK-COPYEXACT®), Polyamide-imides (e.g., Torlon®), Polybenzimidazoles (e.g., Celazole™), and Polyetherimide (e.g., Ultem®).

Thermosetting resins are generally not, however, electrically conductive and when used in pure form may induce charge build-up and subsequent arcing between the wafer and other elements within an ion implantation chamber. In implantation systems, the resins used herein can be filled with an electrically conductive material to create a electrical path between the wafer and the wafer-holding arms to reduce or eliminate the risk of arcing. Suitable materials for this purpose include metallic compounds including and carbon-containing compounds. Alternatively, or in addition, the resin pin can be coated with an electrically conductive coating. The pins can have an electrical bulk resistivity between about 150 ohms/cm and about 10 ohms/cm. More generally, the pins have a bulk resistivity below about 100 ohms/cm, and thus can prevent or substantially mitigate electrical arcing.

FIGS. 16A–B show a wafer-holding pin 300 adapted for use with a wafer holder assembly in accordance with the present invention. The pin has a distal portion 302 having a geometry adapted for holding the edge of a wafer and a proximal portion 304 having a contour complementing a corresponding channel formed in the ends of the wafer arms 106, 110 (FIG. 1). It is understood that a variety of shapes and surface features can be used to securely and releasably mate the pin 300 to the wafer-holding arms.

The distal portion 302 of the pin includes a ridge 306 extending from an arcuate wafer-receiving groove 308 in the pin. A tapered surface 310 extends proximally from the groove 308. As shown in FIG. 17, the pin should contact the top 352 and bottom 354 of the wafer 350 to prevent movement and/or vibration of the wafer as the holder assembly is rotated during the implantation process. In addition, the tapered surface 310 provides a ramp on which the wafer edge may first contact and slide upon during the wafer load process until meeting the ridge 306.

FIGS. 18–23 show a wafer-holding pin 400 in accordance with the present invention having a more limited profile. The pin 400 includes a distal portion 402 for holding a wafer and a proximal portion 404 for coupling to the arm ends. The distal portion 402 of the pin is rounded to minimize the amount of pin material proximate the wafer edge for reducing the likelihood of electrical discharge from the wafer to the pin. In addition, the pin geometry is optimized to maximize the distance between the wafer edge and the pin except at the wafer/pin contact interface. Further, the wafer-contacting region of the pin 400 should be smooth to minimize the electric field generated by a potential difference between the wafer and the pin. The pin should also minimize the wafer/pin contact area.

The distal portion 402 of the pin includes a wafer-receiving groove or neck 406 disposed between a wedge-shaped upper region 408 and a tapered surface 410. The neck 406 can be arcuate to minimize the contact area between the wafer edge and the pin. The upper region 408, including the neck 406, can taper to a point or edge 412 for reducing the amount of pin material near the wafer edge to inhibit electrical arcing between the wafer and the pin.

It is understood that the term wedge-shaped should be construed broadly to include a variety of geometries for the pin upper region. In general, the wedge-shaped upper region broadens from a point nearest a center of a wafer held in the assembly. Exemplary geometries include triangular, arcuate, and polygonal.

Figure 24A:
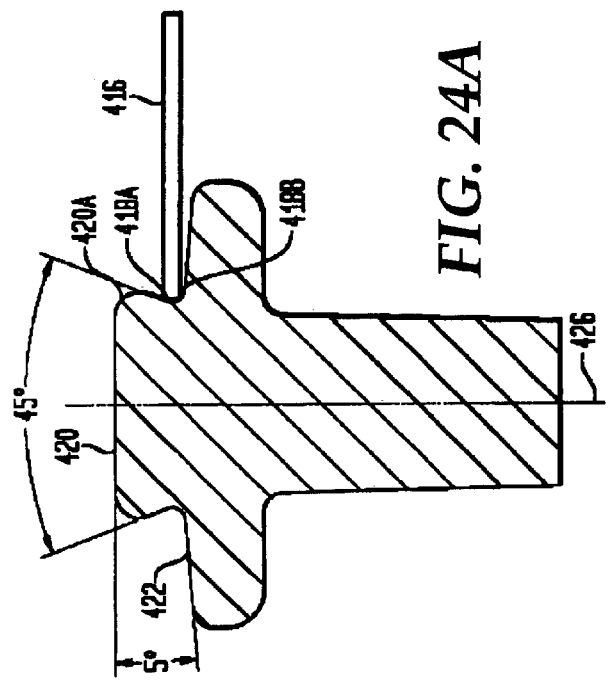
FIG. 24A is a front view of another wafer-holding pin in accordance with the present invention.
Figure 24C:
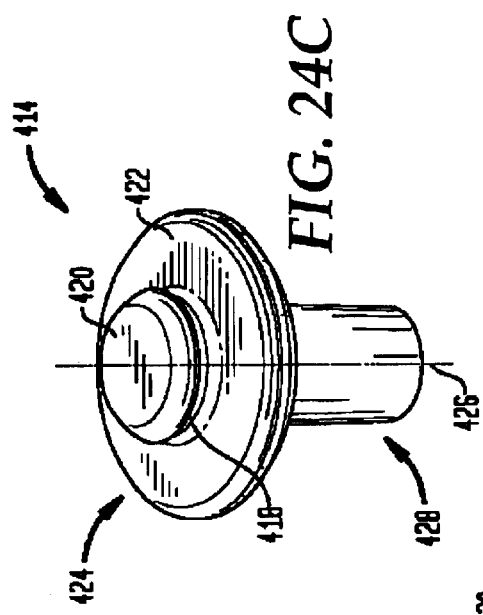
FIG. 24C is a cross-sectional view of the wafer-holding pin of FIG. 24A along line A of FIG. 24B.
Figure 24B:
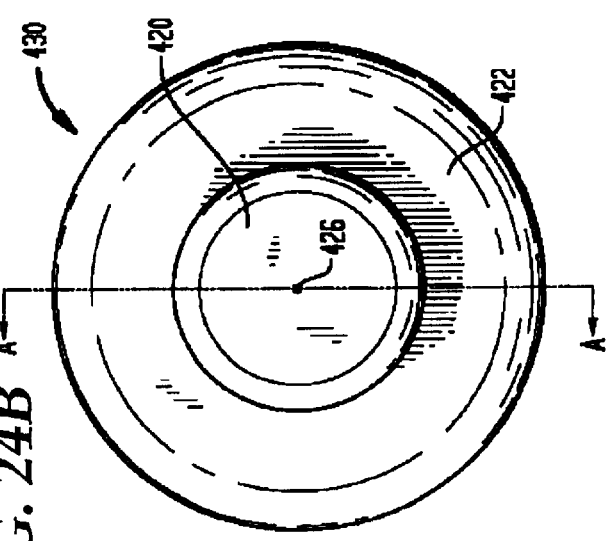
FIG. 24B is a top view of the wafer-holding pin of FIG. 24A.

FIGS. 24A–24C depict another wafer-holding pin 414 in accordance with the present invention. The pin 414 includes a distal portion 424 for holding a wafer 416, a proximal portion 428 for coupling to a wafer holder arm, and a longitudinal axis 426 that extends from the distal portion 424 towards the proximal portion. The proximal portion 428 can be a post that mates to a wafer holder arm. The distal portion 424 has a head 420 coupled to a flange 422, which is wider than the head. For example, if the pin is generally cylindrical in shape, the flange can have a radius that is greater than (e.g., 1.5 times greater than) the radius of the head 420. A wafer-receiving groove 418 with a rounded shape is disposed between the head 420 and the flange 422. This roundness or symmetry of the distal portion 424 provides a curved wafer contact region for securing a wafer 416 regardless of the wafer's direction of approach. Since the wafer contact area of the distal portion can be uniform on all sides, the requirement for precision during pin alignment is reduced.

FIG. 24B is a top view of the same pin 414 as shown in FIG. 24A. The geometry of the pin 414 facilitates wafer placement into the wafer holder, and pin attachment to the wafer holder assembly. Specifically, the geometry of the pin 414 reduces shadowing, reduces electrostatic discharge, and provides for secure wafer gripping while reducing the need for precision when aligning and attaching the pin 414 to a wafer holder arm. As shown in the top view 430, the distal portion can be cylindrical in shape, e.g., cylindrically symmetric about the longitudinal axis 426. (Although the longitudinal axis is depicted in FIG. 24B as running through the body of the pin 414, it should be appreciated that the axis can also be offset such that the pin body does not pass through the axis).

As a result of the symmetry, the distal portion 424 acts as a wafer/pin contact surface that in one embodiment can be uniform on all sides. Regardless of the direction in which a wafer 416 approaches the curved surface 418 the radial symmetry of the distal portion 424 assures secure wafer gripping. In addition to providing secure wafer gripping, the radially symmetric distal portion 424 relaxes the need for precise pin alignment. The pin 414 is able to engage a wafer 416 across a much wider angle of approach. Thus, the radial symmetry reduces the need for precision in aligning the pin 414 when it is attached to the other elements of the wafer-holding assembly.

FIG. 24C is a cross-sectional view of the pin 414 of FIG. 24A with a wafer 416 disposed in the grove 418. The head 420 is shown with a rounded edge 420A at a wafer contact point 418A to provide a reduced profile, and to reduce the amount of pin material overlying the wafer edge. As illustrated, the head 420 is taped at a 45 degree angle with respect to the axis 426 to form the groove, however the angle can be modified according to the dimensions of the wafer 416 and pin 414. This reduced profile of the head 420 reduces shadowing by not obstructing the path of the ion beam. This also has the effect of reducing sputtering, which is typically caused by the ion beam striking the pin (or exposed regions of a holder assembly). In addition, the reduced amount of pin material near the wafer edge reduces the electrical arcing between the wafer 416 and the pin 414 that can occur during the ion implantation process.

The wafer-receiving groove 418 that is disposed between the head 420 and the flange 422 receives and secures the wafer 416 to prevent movement of the wafer. The rounded shape and internal diameter of the groove 418 preferably allows contact only at the top and bottom of the wafer edge at points 418a and 418b, thereby reducing the contact area between the wafer edge and the curved surface 418. The flange 422 is typically tapered in a direction away from the groove 418 to further reduce contact between the wafer 416 and the pin 414. For example, as shown, the flange 422 is tapered away from the groove 418 at an angle of approximately 5 degrees. This angle can be modified according to the thickness of the wafer and size of the groove.

Those skilled in the art will appreciate that the uniform contact surface, as shown and discussed above, is only presented as an example. Pin structures having wafer contact surfaces that are not uniform on all sides can still fall within the scope of the invention.

FIG. 24D shows a preferred embodiment of a wafer-holding assembly 450 according to the invention incorporating wafer-holding pins 414A–C as illustrated in FIGS. 24A–24C. The assembly 450 includes a substantially rigid structural rail member 452 having a proximal portion 454 with a coupler 456 (e.g., to couple with a rotatable hub assembly 250 described above in connection with FIG. 15) and a wafer-holding pin 414A. A distal portion 458 of the rail member can have a plurality, and preferably two, wafer-holding pins 414B, 414C. Although the distal and proximal portions are illustrated as formed by a single structural rail, in a preferred embodiment, the distal portion can be coupled or otherwise releasably attached to the proximal portion thus providing flexibility to interchange the distal portion with other structures suitable for a selected application.

The illustrated structure rail member 452 has a plurality of pin sockets 460, each sized and shaped to receive a wafer-holding pin 414. Each pin can be secured within the socket using a variety of means, such as snap fit, friction fit, threaded or other methods. The means of securing, however, preferably provides electrical coupling between the pin and the structure rail to create an electrical pathway between the wafer and the rail member.

The three sockets 460 illustrated are arranged on the rail member 452 in a triangular pattern to secure the wafer, with two sockets 460A, 460B disposed on the distal portion 458 and one socket 460A disposed on the proximal portion 454 of the rail member. A spring assembly 462 can be coupled to a socket 460A to provide a force to that socket in a direction toward the distal portion to releasably secure the wafer. Other arrangements are contemplated, having four or more wafer-holding pins.

In the illustration, the assembly 450 is sized to handle wafers having a 300-millimeter (mm) diameter. It will be appreciated that assemblies of differing sizes can be used for wafers of various sizes within constraints such as the size of the wafer processing equipment.

Those skilled in the art will appreciate that the uniform contact surface, as shown and discussed above, is only presented as an example. Pin structures having wafer contact surfaces that are not uniform on all sides can still fall within the scope of the invention.

Figure 25:
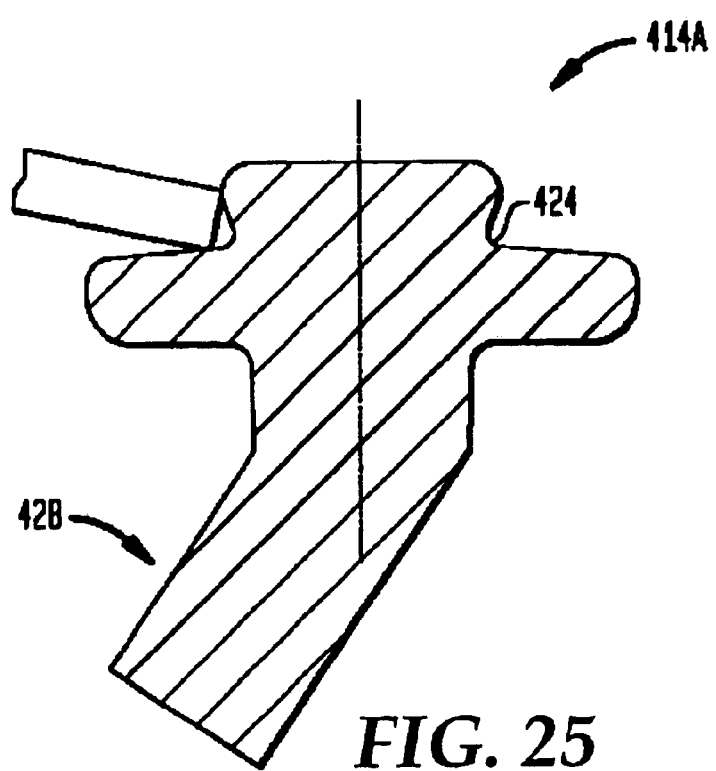
FIG. 25 is a side view of a cylindrically symmetric wafer-holding pin in which the longitudinal axis does not extend along the entire length of the pin.

In FIG. 25, another embodiment of a cylindrically symmetric pin 414A is shown in which the longitudinal axis does not extend along the entire length of the pin, but nonetheless defines an axis about which the wafer contacting surface can be described. Moreover, as shown in FIGS. 26, 26A and 26B, a wafer contact surface can extend for an azimuthal angle of less than 360 degrees, e.g., at least 45 degrees. In this embodiment the distal portion 424 does not have a wafer contact surface that is uniform on all sides. Rather, the wafer contacting surface can extend simply from point 420a to 420b at an angle shown by at that is less than 360 degrees. As shown, the wafer edge 436 of a particular incoming wafer 434 is secured by the distal portion 424 at 438, which is well within the boundaries of the wafer contacting surface as defined by 420a and 420b. Since the wafer contacting surface is still wider than it needs to be to secure the wafer 434, precision requirements for pin alignment remains relaxed. (In this embodiment the longitudinal axis, about which radial symmetry is defined, lies outside the pin body, itself).

In a further aspect of the invention, the materials for the various components other than the pins are selected to provide desired features of the assembly, e.g., mechanical durability; electrical conductivity, and minimal particulation. Exemplary materials for the main structural members, the retainer members, and the bias member include silicon carbide, graphite and vitreous or vacuum impregnated graphite, which can be coated with titanium carbide, or indeed, can be of a material comprising a thermosetting resin such as described above with respect to the wafer-holding pins. The graphite retainer and bias members can be fabricated from graphite sheets using wire electron discharge machine ("wire EDM"), laser machining and conventional cutting techniques.

The graphite bias and retaining members maintain a steady, i.e., invariant, spring constant over a wide range of temperatures. This allows the wafer holder assembly to be adjusted at room temperature for operation at temperatures of 600° C. and higher, which can occur during the ion implantation process. The graphite components also provide a conductive pathway for grounding the wafer via the wafer-holding pins, even where insulative sleeves for the bearing members are used.

The wafer holder assembly of the present invention provides a structure that withstands the relatively high temperatures and ion beam energies associated with SIMOX wafer processing. In addition, the likelihood of wafer contamination is reduced since the ion beam strikes only silicon thereby minimizing carbon contamination and particle production. Furthermore, the likelihood of the electrical discharge from the wafer is minimized due to the selection of conductive materials/coatings for the assembly components and/or the geometry of the wafer-holding pins.

Although described primarily in conjunction with ion implantation processes, it should be appreciated that the wafer-holding structures of the present invention can be used in other high temperature semiconductor or material processes, such as plasma deposition, reactive ion deposition, high temperature chemical vapor deposition, sputtering and the like. One skilled in the art will also appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A wafer-holding pin comprising:
   a distal portion adapted to hold a wafer exposed to an oxygen ion beam, the distal portion comprising a thermosetting resin material suitable for use in a vacuum environment operating at a temperature of about 250 C to about 650 C and able to withstand the oxygen ion beam without substantial oxidation; and
   a proximal portion adapted to couple with a wafer-holding assembly.

2. The wafer-holding pin of claim 1, wherein the proximal portion comprises the thermosetting resin material.

3. The wafer-holding pin of claim 1, wherein the pin is adapted to hold the wafer in a vacuum environment having a temperatures of between approximately 400 C and approximately 625 C.

4. The wafer-holding pin of claim 1, wherein the pin is adapted to hold the wafer in a vacuum environment having a temperature of between approximately 500 C and approximately 600 C.

5. The wafer-holding pin of claim 1, wherein the pin has a thermal conductivity below approximately 0.5 W/m deg. K.

6. The wafer-holding pin of claim 1, wherein the pin has a hardness of approximately equal to or less than the wafer.

7. The wafer-holding pin of claim 6, wherein the pin has a hardness of below approximately 6 on Mohs' hardness scale.

8. The wafer-holding pin of claim 1, further comprising a longitudinal axis extending from the distal portion towards the proximal portion;
   the distal portion having a head coupled to a flange with a wafer-receiving groove therebetween, wherein the groove is adapted to engage an edge of the wafer and has an inner surface that is at least partially cylindrical in shape.

9. The wafer-holding pin of claim 8, wherein the flange is angled in a direction away from the groove.

10. The wafer-holding pin of claim 9, wherein the angle is between approximately 5 degrees and approximately 45 degrees.

11. The wafer-holding pin of claim 1, wherein the pin provides an electrical pathway between the wafer and the wafer-holding assembly.

12. The wafer-holding pin of claim 11, wherein the pin is electrically conductive.

13. The wafer-holding pin of claim 12, wherein the pin comprises a thermosetting resin filled with an electrically conductive material.

14. The wafer-holding pin of claim 13, wherein the conductive material is a metallic compound.

15. The wafer-holding pin of claim 12, wherein the pin comprises a electrically conductive coating.

16. The wafer-holding pin of claim 12, wherein the pin has a bulk resistivity below about 100 ohms per centimeter.

17. In an ion implanter comprising a wafer holder, the improvement of a wafer-holding pin comprising:
   a distal portion adapted to hold a wafer, the distal portion comprising a thermosetting resin material suitable for use in a vacuum environment operating at a temperature of about 250 C to about 650 C and able to withstand an oxygen ion beam without substantial oxidation; and
   a proximal portion adapted to couple with the wafer-holding assembly.

18. The ion implanter of claim 17, wherein the ion implanter comprises any of the group consisting of a plasma etch system and a plasma stripping system.

19. In an ion deposition system comprising a wafer holder, the improvement of a wafer-holding pin comprising:
   a distal portion adapted to hold a wafer, the distal portion comprising a thermosetting resin material suitable for use in a vacuum environment operating at a temperature of between about 250 C and about 650 C and able to withstand an oxygen ion beam without substantial oxidation; and
   a proximal portion adapted to couple with the wafer-holding assembly.

20. The ion deposition system of claim 19, wherein the ion deposition system comprises any of the group consisting of a chemical vapor deposition system, an ion assisted deposition system, and a sputtering deposition system.

21. A wafer-holding pin, comprising:
   a distal portion for holding a wafer, the distal portion comprising a thermosetting resin material suitable for use in a vacuum environment operating at a temperature of between about 250 C and about 650 C and able to withstand an oxygen ion beam without substantial oxidation, the distal portion electrically conductive to provide an electrical pathway between the wafer and a wafer-holding assembly;
   a proximal portion adapted to couple to the wafer-holding assembly; and
   a longitudinal axis extending from the distal portion towards the proximal portion,
   the distal portion having a head coupled to a flange with a wafer-receiving groove therebetween, wherein the groove is adapted to engage an edge of the wafer and has an inner surface that is at least partially cylindrical in shape.

22. The wafer-holding pin according to claim 21, wherein the inner surface exhibits radial symmetry about an axis for an azimuthal angle of at least 45 degrees.

23. The wafer-holding pin according to claim 22, wherein the flange is wider than the head.

24. The wafer-holding pin according to claim 21, wherein the proximal portion further comprises a post that mates with a wafer holder arm of the base structure.

25. The wafer-holding pin according to claim 21, wherein the distal portion further includes a electrically conductive filling.

26. The wafer-holding pin according to claim 25, wherein the electrically conductive filling is carbon.

* * * * *